(12) United States Patent
Nishimura

(10) Patent No.: US 8,248,687 B2
(45) Date of Patent: Aug. 21, 2012

(54) WIDE-BAND OPTICAL AMPLIFIER, OPTICAL PULSE GENERATOR, AND OPTICAL INSTRUMENT

(75) Inventor: Kumiko Nishimura, Tokyo (JP)

(73) Assignee: Nikon Corporation, Tokyo (JP)

(*) Notice: Subject to any disclaimer, the term of this patent is extended or adjusted under 35 U.S.C. 154(b) by 56 days.

(21) Appl. No.: 12/839,991

(22) Filed: Jul. 20, 2010

(65) Prior Publication Data

US 2011/0013265 A1   Jan. 20, 2011

Related U.S. Application Data

(63) Continuation of application No. PCT/JP2009/000136, filed on Jan. 16, 2009.

(30) Foreign Application Priority Data

Jan. 21, 2008 (JP) ................. 2008-010071

(51) Int. Cl.
  *G02F 1/35* (2006.01)
  *H01S 3/091* (2006.01)
  *H01S 3/07* (2006.01)
(52) U.S. Cl. .......... 359/328; 359/345; 359/346; 372/22; 372/105
(58) Field of Classification Search .......... 359/326–332, 359/342, 345, 346; 372/21, 22, 98, 105
  See application file for complete search history.

(56) References Cited

U.S. PATENT DOCUMENTS 5,541,946 A * 7/1996 Scheps et al. ............ 372/23
6,791,743 B2 * 9/2004 Jovanovic et al. ........ 359/333

FOREIGN PATENT DOCUMENTS

| JP | 8-328052 | 12/1996 |
| JP | 2001-066653 | 3/2001 |
| JP | 2005-208472 | 8/2005 |

OTHER PUBLICATIONS

Written opinion from International Searching Authority in PCT/JP2009/00136—Search Report dated Aug. 5, 2010.
International Search Report from Japanese Patent Office for International Application No. PCT/JP2009/000136, mailed Feb. 24, 2009.
Witte, S. et al., "A Source of 2 Terawatt, 2.7 Cycle Laser Pulse Based on Noncollinear Optical Parametric Chirped Pulse Amplification," Optics Express, vol. 14, No. 18, pp. 8168-8177, (2006).
Yamakawa, K. et al., "Ultra-Broadband Optical Parametric Chirped-Pulse Amplification Using an Yb: $LiYF_4$ Chirped-Pulse Amplification Pump Laser," Optics Express, vol. 15, No. 8, pp. 5018-5023, (2007).

* cited by examiner

*Primary Examiner* — Daniel Petkovsek
(74) *Attorney, Agent, or Firm* — Finnegan, Henderson, Farabow, Garrett & Dunner, L.L.P.

(57) ABSTRACT

There is provided a wide-band optical amplifier (10) that is capable of amplifying a wide-band signal. The wide-band optical amplifier (10) includes a first amplifier (NOPA1) that emits, based on a to-be-amplified light beam having a predetermined range of wavelengths and a first pump beam (L2) having a first wavelength, the to-be-amplified light beam having a first range of amplified wavelengths, where the first range is a part of the predetermined range, and a second amplifier (NOPA2) that emits, based on the to-be-amplified light beam having the first range of amplified wavelengths and a second pump beam (L3) having a second wavelength different from the first wavelength, the to-be-amplified light beam having a second range of amplified wavelengths, where the second range is different from the first range.

10 Claims, 8 Drawing Sheets

FIG.4E  478THz=300000[km/s]/350[nm]−300000[km/s]/790[nm]

WIDE-BAND OPTICAL AMPLIFIER, OPTICAL PULSE GENERATOR, AND OPTICAL INSTRUMENT

CROSS REFERENCE TO RELATED APPLICATION

The contents of the following patent applications are incorporated herein by reference, PCT/JP2009/000136 filed on Jan. 16, 2009, and Japanese application NO. 2008-010071 filed on Jan. 21, 2008.

BACKGROUND

1. Technical Field

The present invention relates to a wide-band optical amplifier for generating an ultrashort optical pulse, an optical pulse generator using the wide-band optical amplifier, and an optical instrument using the optical pulse generator.

2. Description of the Related Art

Femtosecond pulse lasers are, for example, utilized in the field of spectroscopy by taking advantage of their high temporal resolution. Numerous phenomena such as the phase relaxation, internal conversion, photochemical reactions, and molecular vibration characteristically occur in the domain of femtoseconds. Thus, the applicability of the femtosecond pulse lasers has been expanded. The above-mentioned phenomena occur at very fast time scales such as at the rates of several dozen femtoseconds or less. Accordingly, femtosecond pulse laser sources that can deal with faster time scales are desired.

Patent Document 1: Japanese Patent Application Publication No. 2001-066653

In attempts to achieve further shorter pulses, it is desired to further increase the temporal resolution in order to observe faster phenomena. In other words, femtosecond pulse laser sources are desired which can generate optical pulses whose durations are as short as less than five femtoseconds or on the order of the attosecond.

SUMMARY

It is an object of the present invention to provide a wide-band optical amplifier that is capable of amplifying wide-band signals to generate ultrashort optical pulses. It is another object of the present invention to provide an optical pulse generator using the above wide-band optical amplifier and an optical instrument using the optical pulse generator.

A wide-band optical amplifier relating to a first aspect of the present invention includes a first amplifier that emits, based on a to-be-amplified light beam having a predetermined range of wavelengths and a first pump beam having a first wavelength, the to-be-amplified light beam having a first range of amplified wavelengths, where the first range is a part of the predetermined range, and a second amplifier that emits, based on the to-be-amplified light beam having the first range of amplified wavelengths and a second pump beam having a second wavelength different from the first wavelength, the to-be-amplified light beam having a second range of amplified wavelengths, where the second range is different from the first range.

An optical pulse generator relating to a second aspect of the present invention includes a fundamental laser source that outputs a predetermined frequency, a first converter that converts a laser beam emitted from the fundamental laser source into an N-th harmonic and emits the N-th harmonic as a first pump beam, a second converter that converts the laser beam emitted from the fundamental laser source into an (N+1)-th harmonic and emits the (N+1)-th harmonic as a second pump beam, a first amplifier that receives a to-be-amplified light beam having a predetermined range of visible wavelengths and the first pump beam, amplifies a first range of wavelengths of the to-be-amplified light beam and emits the resulting to-be-amplified light beam, and a second amplifier that receives the to-be-amplified light beam having the first range of amplified wavelengths and the second pump beam, amplifies a second range of wavelengths of the to-be-amplified light beam and emits the resulting to-be-amplified light beam, where the second range is different from the first range.

An optical instrument relating to a third aspect of the present invention uses the optical pulse generator relating to the second aspect.

The present invention can provide a wide-band optical amplifier that is capable of amplifying wide-band signals.

BRIEF DESCRIPTION OF THE DRAWINGS

FIGS. 4A to 4E conceptually illustrate how a white light beam WH is amplified in the first and second embodiments.

DESCRIPTION OF EXEMPLARY EMBODIMENTS

<First Embodiment>

Figure 1:
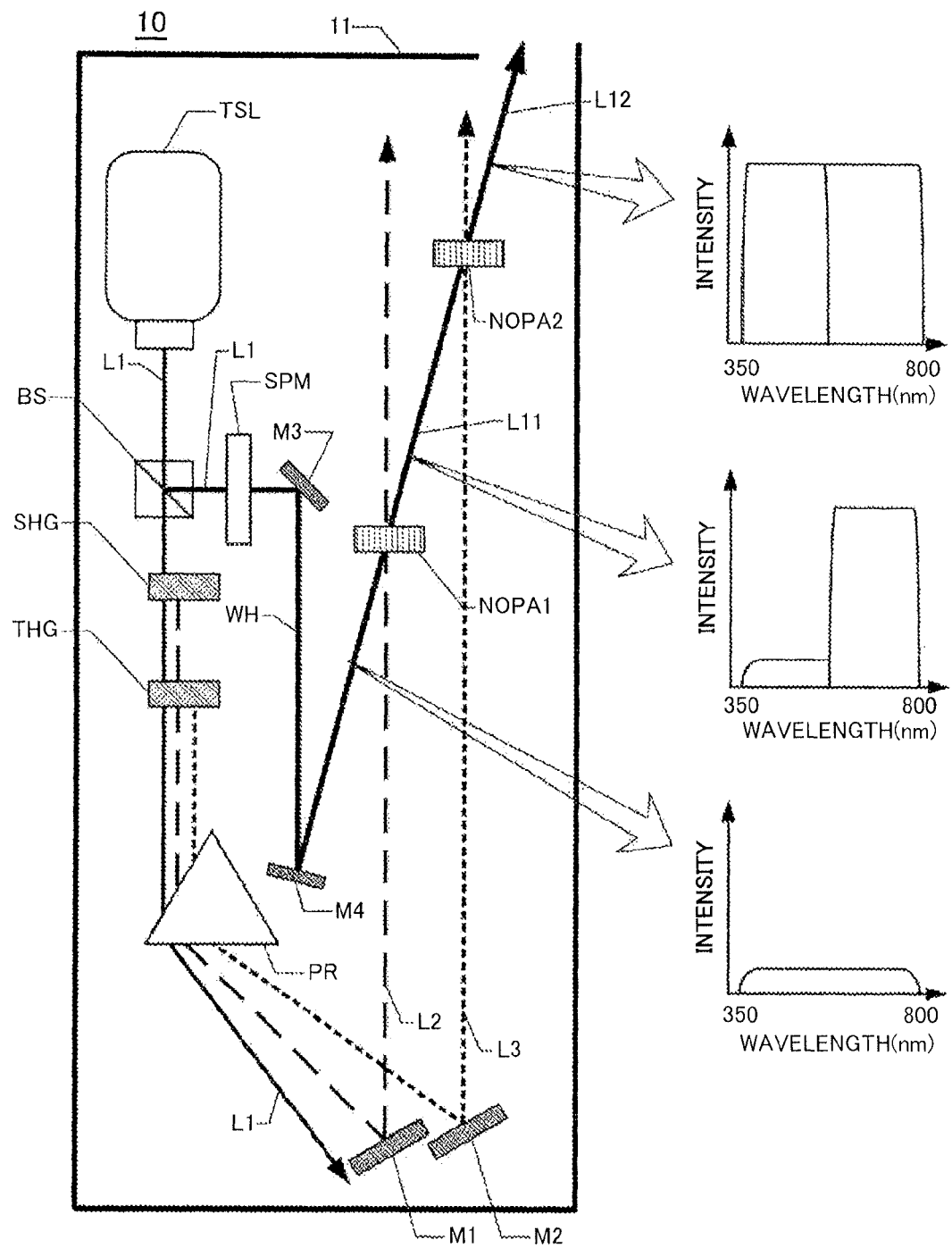
FIG. 1 schematically illustrates a wide-band optical amplifier 10 relating to a first embodiment.

A wide-band optical amplifier 10 relating to a first embodiment of the present invention will be described in detail with reference to FIG. 1. FIG. 1 schematically illustrates the wide-band optical amplifier 10.

The wide-band optical amplifier 10 has, within a housing 11, a titanium sapphire laser source TSL, a beam splitter BS, and first and second frequency converters that receive one of the light beams L1 produced by the beam splitter BS. The first frequency converter is, for example, a second harmonic generator SHG, and the second frequency converter is, for example, a third harmonic generator THG. The wide-band optical amplifier 10 further has a self phase modulator SPM that receives the other of the light beams L1 produced by the beam splitter BS, a prism PR that is a refractive optical element for refracting a light beam, a first non-collinear optical parametric amplifier NOPA1, and a second non-collinear optical parametric amplifier NOPA2. The principle of a non-collinear optical parametric amplifier NOPA is achieved by developing the principle of a generally known OPA and may be simply explained as follows. An OPA realizes amplification based on second nonlinear polarization of a nonlinear optical crystal. Specifically speaking, amplification takes place in the nonlinear optical crystal under the condition that a pump beam, a signal beam and an idler beam simultaneously satisfy the energy conservation law and the momentum conservation law. The momentum conservation law is equivalent to the phase matching condition between the pump beam and the signal beam. If the signal beam enters the nonlinear optical crystal while the nonlinear optical crystal is pumped by the pump beam, the signal beam is amplified through the optical parametric effects. In this case, since the anisotropy of the refractive index is not made sufficiently high, it is only a narrow band which satisfies the phase matching condition. Accordingly, the pulse duration is not made shorter than or equal to approximately 20 fs. An NOPA overcomes such a limitation and can thus amplify wide-band light such as white light. By controlling a signal beam and a pump beam to enter a nonlinear optical crystal non-coaxially at a certain angle relative to each other, the projective component in the signal beam direction of the group velocity of an idler beam matches the group velocity of the signal beam, and the group velocity mismatch between the signal beam and the idler beam is thus removed. In this case, the resulting bandwidth is one digit wider than the bandwidth obtained with the coaxial entrance. Generally speaking, phase matching is classified into two types, namely, type-I and type-II. The NOPA relating to the present embodiment is configured based on the type-I phase matching with the pump beam being the extraordinary beam and the signal and idler beams being the ordinary beam. The gain and gain band of the amplification depend on such parameters as the cutting angle of the nonlinear optical crystal, the angle between the pump beam and the signal beam that enter the nonlinear optical crystal non-coaxially, and the incident angle of the pump beam, and optimal gain and gain band can be determined in numerical calculations.

The titanium sapphire laser source TSL emits a light beam L1 having an output of 1.4 w, a pulse duration of 100 fs, a repetitive pulse frequency of 1 kHz, and a wavelength of 790 nm, The light beam L1 emitted from the titanium sapphire laser source TSL is split by the beam splitter BS. Approximately 90% of the light beam L1 emitted from the titanium sapphire laser source TSL is directed towards the second harmonic generator SHG, and approximately 10% or lower is directed towards the self phase modulator SPM.

One of the light beams L1 from the beam splitter BS enters the second harmonic generator SHG, and the second harmonic generator SHG emits the light beam L1 and a light beam L2 that is a second harmonic having a wavelength of 395 nm. The light beams L1 and L2 enter the third harmonic generator THG, and the third harmonic generator THG emits the light beam L1, the light beam L2, and a light beam L3 having a wavelength of 263 nm. The light beams L2 and L3 serve as a pump beam for a white light beam WH, which will be described later.

The light beams L1, L2, and L3 enter the refractive optical element. The refractive optical element is, for example, the prism PR. The prism PR separates the light beams L1, L2 and L3 from each other by taking advantage of the fact that its refractive index differs according to the wavelength. The separated light beam L2 is reflected by a first mirror M1 so as to enter the first non-collinear optical parametric amplifier NOPA1 at a predetermined angle. The separated light beam L3 is reflected by a second mirror M2 so as to enter the second non-collinear optical parametric amplifier NOPA2 at a predetermined angle.

The other of the light beams L1 from the beam splitter BS enters the self phase modulator SPM. The self phase modulator SPM modulates the frequency through the nonlinear variation in refractive index that is caused by intense light collection at a nonlinear medium, thereby converting the input light into white light with a wide-band spectrum. The self phase modulator SPM is specifically a nonlinear optical element made of fluoride glass, and converts the light beam L1 emitted from the titanium sapphire laser source TSL into a white light beam WH having a range of wavelengths at least from 350 nm to 790 nm. The white light beam WH is a signal beam, which is a beam to be amplified by the wide-band optical amplifier 10, and is reflected by a third mirror M3 and a fourth mirror M4 so as to enter the first non-collinear optical parametric amplifier NOPA1 and the second non-collinear optical parametric amplifier NOPA2 respectively at predetermined angles.

The first and second non-collinear optical parametric amplifier NOPA1 and NOPA2 are formed by using a nonlinear optical crystal. Specifically speaking, the first and second non-collinear optical parametric amplifier NOPA1 and NOPA2 can be formed by using one of a BBO (β-BaB$_2$O$_4$) crystal, a KABO (K$_2$Al$_2$B$_2$O$_7$) crystal, a BNA crystal, and an LBO (LiB$_3$O$_5$) crystal. These crystals simultaneously interact with two or more types of optical waves. Here, since the performances of the BBO crystal and other crystals vary depending on the humidity, the BBO crystal and other crystals are subjected to a dry nitrogen purge so as to maintain the constant performances of the BBO crystal and other crystals.

The white light beam WH, which is the signal beam, and the light beam L2, which is the pump beam, enter the first non-collinear optical parametric amplifier NOPA1 non-coaxially at an angle relative to each other. The entrance of the light beam L2 into the first non-collinear optical parametric amplifier NOPA1 pumps the first non-collinear optical parametric amplifier NOPA1, so that an idler beam ID is generated within the first non-collinear optical parametric amplifier NOPA1. When the projective component in the signal beam direction of the group velocity of the idler beam ID matches the group velocity of the white light beam WH, the white light beam WH, which is the signal beam, is amplified. Thus, the first non-collinear optical parametric amplifier NOPA1 emits an amplified signal beam L11.

The amplified signal beam L11 and the light beam L3, which is the pump beam, enter the second non-collinear optical parametric amplifier NOPA2 non-coaxially at an angle relative to each other. The entrance of the light beam L3 into the second non-collinear optical parametric amplifier NOPA2 pumps the second non-collinear optical parametric amplifier NOPA2, so that an idler beam ID is generated within the second non-collinear optical parametric amplifier NOPA2. When the projective component in the signal beam direction of the group velocity of the idler beam ID matches the group velocity of the signal beam L11, the signal beam L11 is amplified. Thus, the second non-collinear optical parametric amplifier NOPA2 emits an amplified signal beam L12.

The bottom graph shown on the right side in FIG. 1 shows the wavelength and intensity of the white light beam WH traveling from the self phase modulator SPM to the first non-collinear optical parametric amplifier NOPA1. As shown in this graph, the white light beam WH has a range of wavelengths at least from 350 nm to 790 nm and a low intensity.

The middle graph shown on the right side in FIG. 1 shows the wavelength and intensity of the light beam L11 traveling from the first non-collinear optical parametric amplifier NOPA1 to the second non-collinear optical parametric amplifier NOPA2. As seen from this graph, as a result of the pumping caused by the light beam L2, whose wavelength is 395 nm, the light beam L11 has a range of approximately dozens- to hundreds-fold amplified wavelengths from approximately 500 nm to 790 nm. However, the pumping caused by the light beam L2, whose wavelength is 395 nm, does not amplify the range of wavelengths from approximately 350 nm to 500 nm.

The top graph shown on the right side in FIG. 1 shows the wavelength and intensity of the light beam L12 traveling from the second non-collinear optical parametric amplifier NOPA2. As seen from this graph, as a result of the pumping caused by the light beam L3, whose wavelength is 263 nm, the light beam L12 has a range of approximately dozens- to hundreds-fold amplified wavelengths from approximately 350 nm to 500 nm. In combination with the range of amplified wavelengths from approximately 500 nm to 790 nm in the light beam L11, the light beam L12 has a range of amplified wavelengths from approximately 350 nm to 790 nm.

The following describes how the signal beam is amplified by the pump beam with reference to FIGS. 2A to 2D.

Figure 2A:
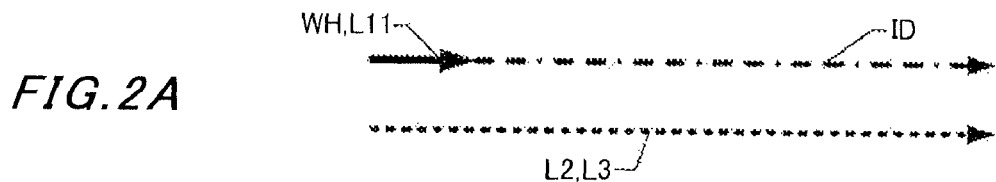
FIGS. 2A to 2D illustrate how a signal beam is amplified by a pump beam.

Referring to FIG. 2A, when the light beam L2, which is the pump beam, enters the first non-collinear optical parametric amplifier NOPA1, the first non-collinear optical parametric amplifier NOPA1 is pumped, so that an idler beam ID is generated and the white light beam WH is accordingly amplified. FIG. 2A shows as if the signal beam is amplified several-fold, but the signal beam can be amplified dozens- to hundreds-fold. Likewise, when the light beam L3, which is the pump beam, enters the second non-collinear optical parametric amplifier NOPA2, the second non-collinear optical parametric amplifier NOPA2 is pumped, so that an idler beam ID is generated and the signal beam L11 is accordingly amplified. Note that FIG. 2A assumes that the projective component in the signal beam direction of the group velocity of the idler beam ID matches the group velocity of the signal beam L11.

The generated idler beam ID travels in different directions depending on the wavelength of the pump beam that enters the non-collinear optical parametric amplifier NOPA formed by, for example, the BBO crystal and the type and crystal axis of, for example, the BBO crystal.

Figure 2B:
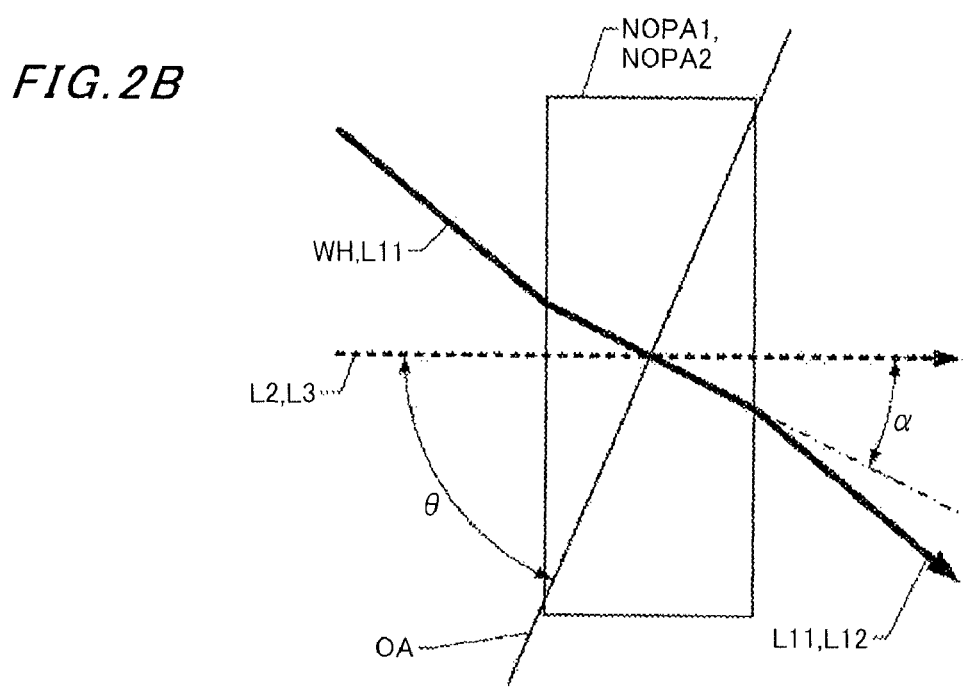

FIG. 2B shows the relation between the signal beam and the pump beam that enter the non-collinear optical parametric amplifier NOPA formed by, for example, the BBO crystal. The maximum phase matching gain (the measure of the amplification efficiency) is determined based on the angle α in the nonlinear crystal between the signal beam and the pump beam and the angle θ between the pump beam and the optical axis OA of, for example, the B13O crystal. In accordance with the parameters such as the angle α and the angle θ that are determined to produce the maximum phase matching gain, the optical axis OA of the non-collinear optical parametric amplifier NOPA is determined and the mirrors M3 and M4 and the non-collinear optical parametric amplifier NOPA are positioned.

Figure 2C:
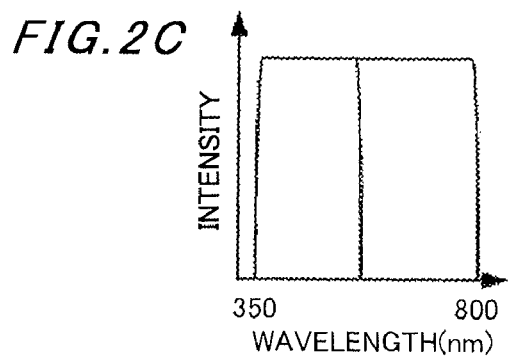
Figure 2D:
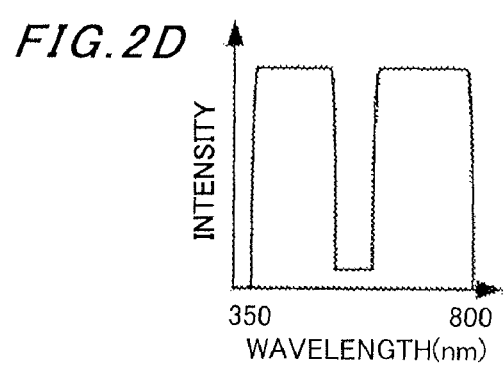

FIG. 2C shows the amplified signal beam observed when the parameters such as the angle α and the angle θ are optimally selected. FIG. 2D shows the amplified signal beam observed when the parameters such as the angle α and the angle θ are not optimally selected.

As seen from FIG. 2C, when the first and second non-collinear optical parametric amplifier NOPA1 and NOPA2 appropriately amplify the signal beams, the wide range of wavelengths from 350 nm to 790 nm are amplified. On the other hand, when the parameters such as the angle α and the angle θ are not optimally selected, a part of the wide range of wavelengths from 350 nm to 790 nm is not amplified as shown in FIG. 2D. If such occurs, an ultrashort optical pulse having a duration of less than 5 femtoseconds cannot be generated. Here, the range of wavelengths amplified by the first non-collinear optical parametric amplifier NOPA1 may partially overlap the range of wavelengths amplified by the second non-collinear optical parametric amplifier NOPA2, provided that no range of wavelengths fails to be amplified.

According to the first embodiment described above, a to-be-amplified light beam and a first pump beam enter a first amplifier, so that a first range of wavelengths is amplified, and the to-be-amplified light beam with the first range of amplified wavelengths and a second pump beam enter a second amplifier, so that a second range of wavelengths is amplified. Here, the first and second ranges are different. With such a configuration, the first embodiment can amplify a wide-band light beam having the first and second ranges of wavelengths.

The first embodiment produces the first pump beam and the second pump beam by generating an N-th harmonic and an a (N+1)-th harmonic of a laser beam having a predetermined wavelength output from a fundamental laser source. The first and second amplifiers respectively amplify the first and second ranges of wavelengths of the to-be-amplified light beam having a predetermined range of wavelengths. In this way, the first embodiment can amplify a wide-band light beam having a wide range of wavelengths covering both the first and second ranges of wavelengths, and can generate an ultrashort optical pulse whose pulse duration is less than five femtoseconds by using the wide-band light beam.

<Second Embodiment>

A wide-band optical amplifier 20 relating to a second embodiment of the present invention will be described in detail with reference to FIG. 3.

Figure 3:
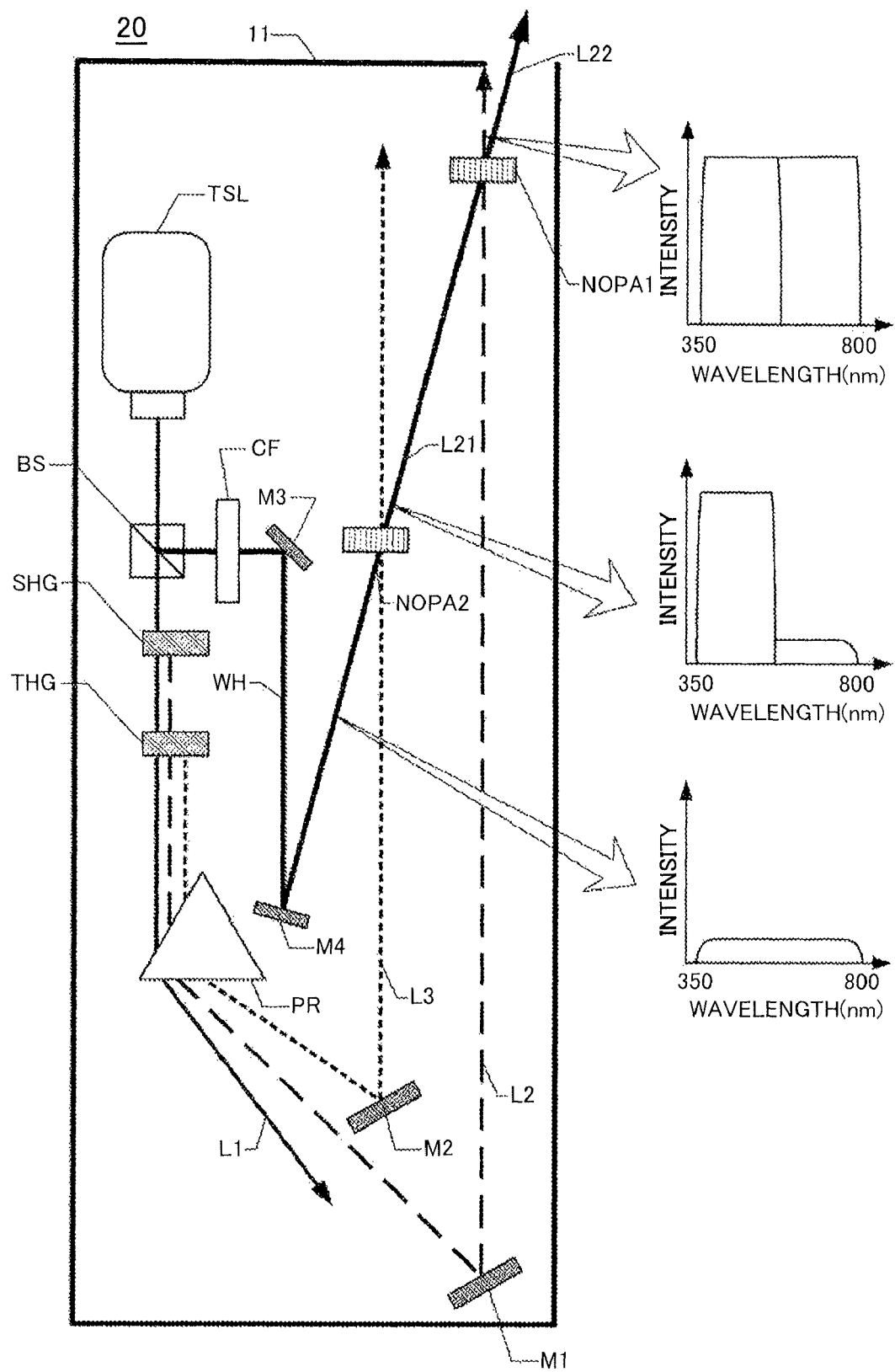
FIG. 3 schematically illustrates a wide-band optical amplifier 30 relating to a second embodiment.

FIG. 3 schematically illustrates the wide-band optical amplifier 20. The identical constituents between the first and second embodiments are denoted by the same reference numerals. The following describes the second embodiment with a particular focus on its differences from the first embodiment.

The wide-band optical amplifier 20 relating to the second embodiment is different from the wide-band optical amplifier 10 relating to the first embodiment in that the first and second non-collinear optical parametric amplifiers NOPA1 and NOPA2 are switched. Thus, the first mirror M1 is positioned differently to enable the light beam L2 to enter the first non-collinear optical parametric amplifier NOPA1 at a predetermined angle, and the second mirror M2 is positioned differently to enable the light beam L3 to enter the second non-collinear optical parametric amplifier NOPA2 at a predetermined angle.

The bottom graph shown on the right side in FIG. 3 shows the white light beam WH traveling from the self phase modulator SPM to the second non-collinear optical parametric amplifier NOPA2, as in the first embodiment. The white light beam WH has a low intensity.

The middle graph shown on the right side in FIG. 3 shows the wavelength and intensity of a light beam L21 traveling from the second non-collinear optical parametric amplifier NOPA2 to the first non-collinear optical parametric amplifier NOPA1. As seen from this graph, as a result of the pumping caused by the light beam L3, whose wavelength is 263 nm, the light beam L21 has a range of approximately dozens- to hundreds-fold amplified wavelengths from approximately 350 nm to 500 nm. That is to say, the range of wavelengths from approximately 350 nm to 500 nm are first amplified, differently from the first embodiment.

The top graph shown on the right side in FIG. 3 shows the wavelength and intensity of a light beam L22 traveling from the first non-collinear optical parametric amplifier NOPA1.

As seen from this graph, as a result of the pumping caused by the light beam L2, whose wavelength is 395 nm, the light beam L22 has a range of approximately dozens- to hundreds-fold amplified wavelengths from approximately 500 nm to 790 nm. In combination with the range of amplified wavelengths from approximately 350 nm to 500 nm in the light beam L21, the light beam L22 has a range of amplified wavelengths from approximately 350 nm to 790 nm.

FIGS. 4A to 4E conceptually illustrate how the white light beam WH is amplified in the first and second embodiments.

Figure 4A:
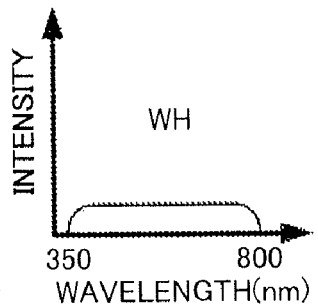

According to the first and second embodiments, the signal beam has a range of wavelengths from 350 nm to 790 nm as shown in FIG. 4A. When the white light beam WH, which is the signal beam, and the second harmonic having a wavelength of 395 nm, which is the pump beam, are controlled to achieve non-coaxial phase matching in the first non-collinear optical parametric amplifier NOPA1 shown in FIG. 4B, the group velocity of the signal beam matches the projective component in the signal beam direction of the group velocity of the idler beam ID. As a result, the range of wavelengths from approximately 500 nm to 790 nm of the white light beam WH is amplified approximately dozens- to hundreds-fold as shown in FIG. 4C.

Figure 4B:
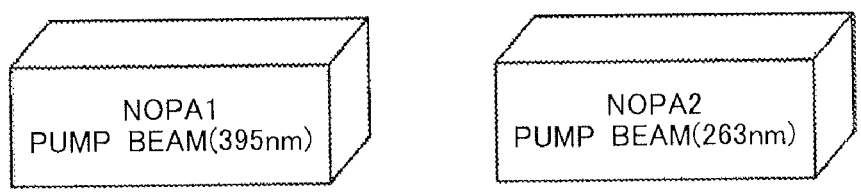

When the white light beam WH and the third harmonic having a wavelength of 263 nm, which is the pump beam, are controlled to achieve non-coaxial phase matching in the second non-collinear optical parametric amplifier NOPA2 shown in FIG. 4B, the group velocity of the signal beam matches the projective component in the signal beam direction of the group velocity of the idler beam ID. As a result, the range of wavelengths from approximately 350 nm to 500 nm of the white light beam WH is amplified approximately dozens- to hundreds-fold as shown in FIG. 4C.

Figure 4C:
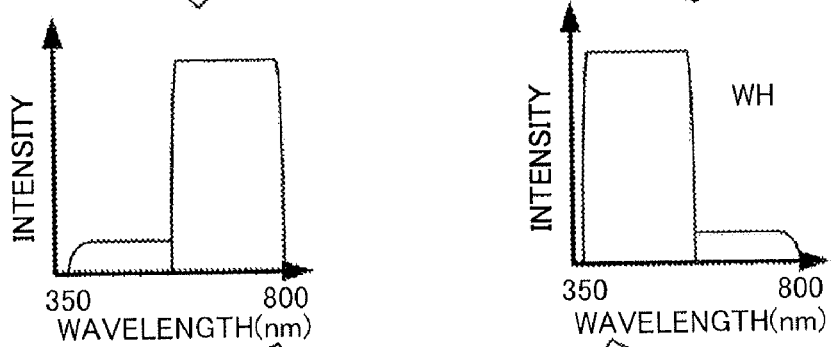
Figure 4D:
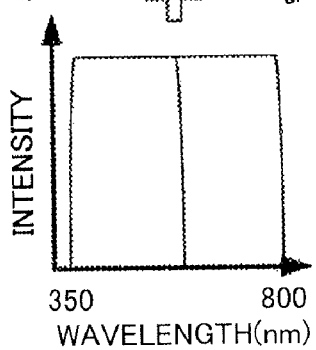

When the range of amplified wavelengths from approximately 350 nm to 500 nm and the range of amplified wavelengths from approximately 500 nm to 790 nm shown in FIG. 4C are added together, the range of amplified wavelengths from approximately 350 nm to 790 nm is obtained as shown in FIG. 4D. It should be noted, however, that the addition requires the following controls.

It is required to adjust the angles at which the white light beam WH enters the first and second non-collinear optical parametric amplifiers NOPA1 and NOPA2. It is also required to adjust the angle at which the light beam L2 (the second harmonic having a wavelength of 395 nm) enters the first non-collinear optical parametric amplifier NOPA1 and the angle at which the light beam L3 (the third harmonic having a wavelength of 263 nm) enters the second non-collinear optical parametric amplifier NOPA2.

The wide-band optical amplifiers 10 and 20 can amplify light having a wide range of wavelengths from approximately 350 nm to 790 nm, and therefore amplify as wide a range as 478 THz according to the theoretical calculation shown in FIG. 4E. Accordingly, the wide-band optical amplifiers 10 and 20 can produce an optical pulse generator that generates an ultrashort optical pulse whose duration is approximately two femtoseconds.

<Third Embodiment>

A wide-band optical amplifier 30 relating to a third embodiment of the present invention will be described in detail with reference to FIG. 5.

Figure 5:
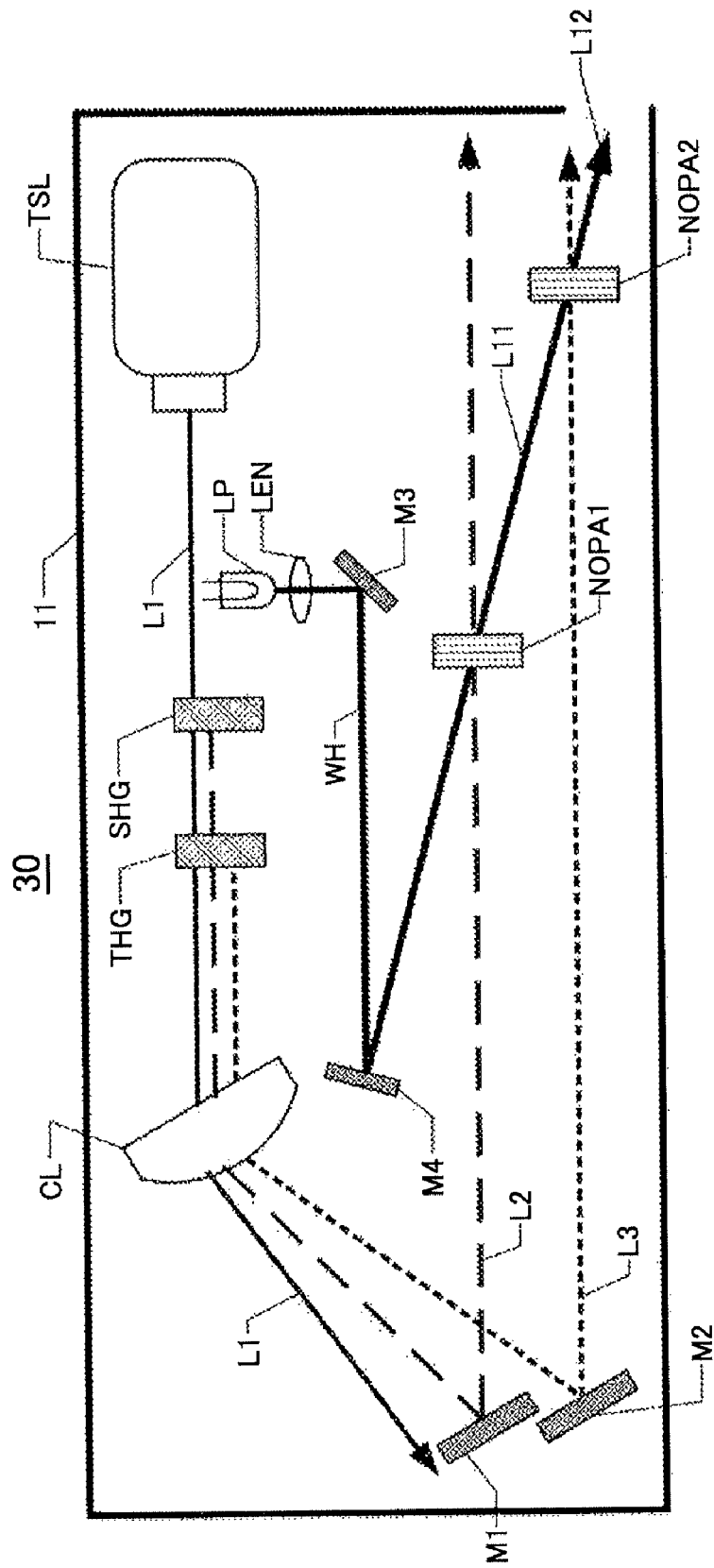
FIG. 5 schematically illustrates a wide-band optical amplifier 30 relating to a third embodiment.

FIG. 5 schematically illustrates the wide-band optical amplifier 30. The identical constituents between the first and third embodiments are denoted by the same reference numerals. The following describes the third embodiment with a particular focus on its differences from the first embodiment.

The wide-band optical amplifier 30 relating to the third embodiment is different from the wide-band optical amplifier 10 relating to the first embodiment in that the beam splitter BS and the self phase modulator SPM are replaced with a white light source LP and a collective lens LEN. In the wide-band optical amplifier 30, the white light source LP generates a white light beam WH having a range of wavelengths at least from 350 nm to 790 nm. The white light source LP emits a coherent light beam having a range of wavelengths from 300 nm to 900 nm. Such a coherent light source that emits a coherent light beam having a range of wavelengths from 300 nm to 900 nm can be a light source using a nonlinear optical fiber or a solid-state laser. This white light beam WH is treated as a signal beam of the wide-band optical amplifier 30 and enters the first and second non-collinear optical parametric amplifiers NOPA1 and NOPA2 respectively at predetermined angles.

The light beam L1 from the titanium sapphire laser source TSL enters the second harmonic generator SHG and then enters the third harmonic generator THG. In other words, the light beam L1 emitted from the titanium sapphire laser source TSL is only used to generate the pump beams (the light beams L2 and L3) in the third embodiment.

In the wide-band optical amplifier 30 relating to the third embodiment, the refractive optical element is, for example, a cylindrical lens CL that has a small Abbe number. The use of such a high-dispersion lens with a small Abbe number makes it possible to distinctively separate the light beams according to their wavelengths. The cylindrical lens CL separates the light beams L1, L2, and L3 from each other by exploiting the fact that its refractive index varies depending on the wavelength.

<Fourth Embodiment>

A wide-band optical amplifier 40 relating to a fourth embodiment of the present invention will be described in detail with reference to FIG. 6.

Figure 6:
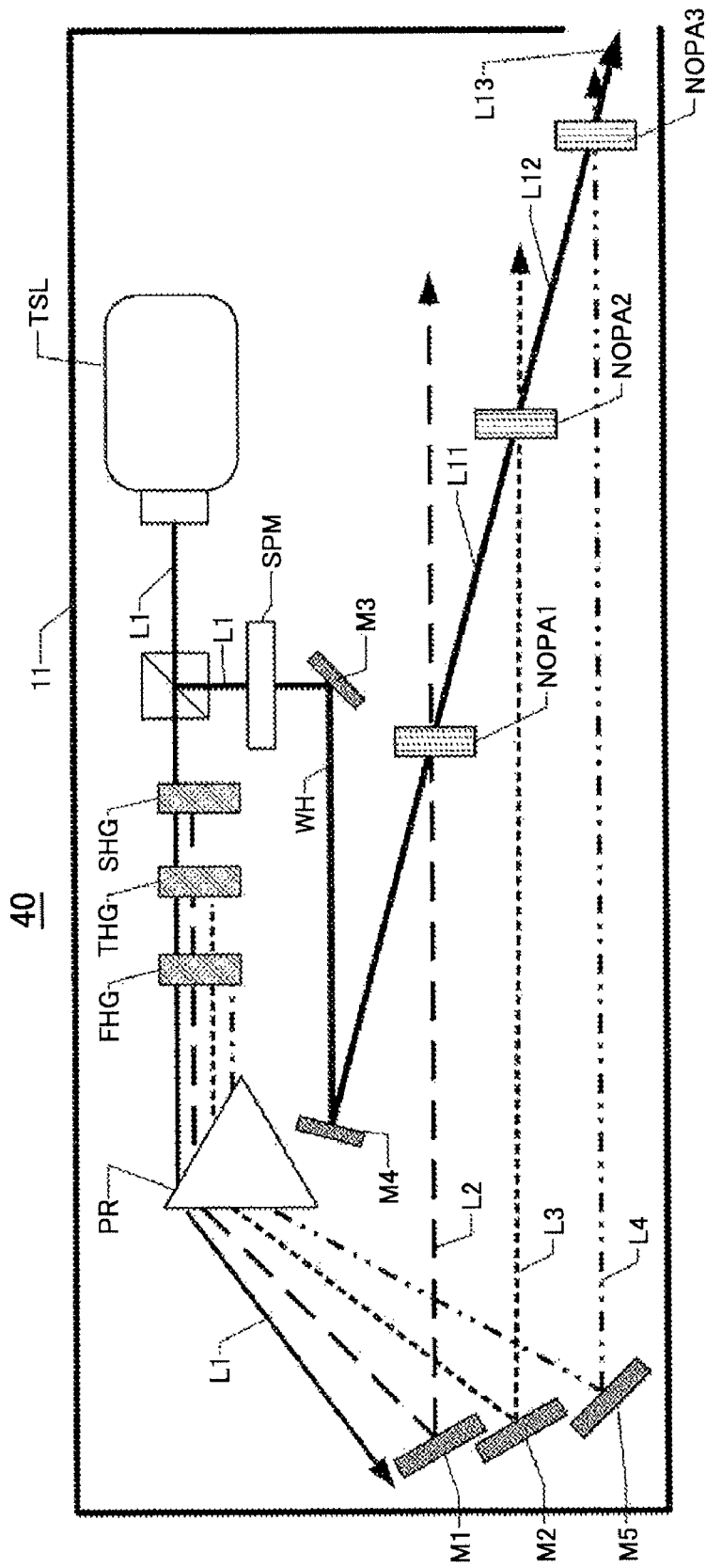
FIG. 6 schematically illustrates a wide-band optical amplifier 40 relating to a fourth embodiment.

FIG. 6 schematically illustrates the wide-band optical amplifier 40. The identical constituents between the first and fourth embodiments are denoted by the same reference numerals. The following describes the fourth embodiment with a particular focus on its differences from the first embodiment.

The wide-band optical amplifier 40 relating to the fourth embodiment is different from the wide-band optical amplifier 10 relating to the first embodiment in that a fourth harmonic generator FHG and a third non-collinear optical parametric amplifier NOPA3 are additionally provided. The fourth harmonic generator FHG emits a light beam L4, which is a fourth harmonic having a wavelength of 198 nm. The wide-band optical amplifier 40 includes a fifth mirror M5 to enable the light beam L4, which is the fourth harmonic and has been refracted by the prism PR, to enter the third non-collinear optical parametric amplifier NOPA3 at a predetermined angle.

In the fourth embodiment, the self phase modulator SPM converts the light beam L1 emitted from the titanium sapphire laser source TSL into the white light beam WH having a range of wavelengths at least from 310 nm to 790 nm. The white light beam WH, which is the signal beam, and the light beam L2, which is the pump beam, enter the first non-collinear optical parametric amplifier NOPA1 non-coaxially at an angle relative to each other. As a result of the pumping caused by the light beam L2 having a wavelength of 395 nm, the light beam L11 has a range of approximately dozens- to hundreds-fold amplified wavelengths from approximately 500 nm to 790 nm.

The signal beam L11 and the light beam L3, which is the pump beam, enter the second non-collinear optical parametric amplifier NOPA2 non-coaxially at an angle relative to each other. As a result of the pumping caused by the light beam L3 having a wavelength of 263 nm, the light beam L12 has a range of approximately dozens- to hundreds-fold amplified wavelengths from approximately 350 nm to 500 nm.

The signal beam L12 and the light beam L4, which is the pump beam, enter the third non-collinear optical parametric amplifier NOPA3 non-coaxially at an angle relative to each other. As a result of the pumping caused by the light beam L4 having a wavelength of 198 nm, a light beam L13 has a range of approximately dozens- to hundreds-fold amplified wavelengths from approximately 310 nm to 350 nm. Thus, in combination with the range of amplified wavelengths from approximately 500 nm to 790 nm in the light beam L11 and the range of amplified wavelengths from approximately 350 nm to 500 nm in the light beam L12, the light beam L13 has a range of amplified wavelengths from approximately 310 nm to 790 nm. The wide-band optical amplifier 40 relating to the fourth embodiment can amplify as wide a range as 580 THz or more according to theoretical calculations. As described above, the wide-band optical amplifier 40 relating to the fourth embodiment can amplify a wide-band white light beam WH by including therein a high-order harmonic generator FHG and a non-collinear optical parametric amplifier NOPA that is suitable for the pump beam generated by the high-order harmonic generator FHG.

As described above, the first to fourth embodiments can amplify a wide-band light beam, thereby being capable of amplifying a wide-band signal whose bandwidth is as wide as 450 THz or more. Since the bandwidth is substantially inversely related to the pulse duration, the first to fourth embodiments can provide a femtosecond pulse laser source that may function as an optical pulse generator capable of generating an ultrashort optical pulse whose duration is less than five femtoseconds.

The present invention is not limited to the first to fourth embodiments, and allows numerous modifications and alternations. For example, the wide-band optical amplifier 10 can use a third harmonic and a fourth harmonic. Furthermore, the titanium sapphire laser source TSL can be provided outside the housing 11 in the first to fourth embodiments.

<Fifth Embodiment>

The following briefly describes an optical instrument using a femtosecond pulse laser source 110, which is an optical pulse generator relating to the above-described embodiments.

Figure 7:
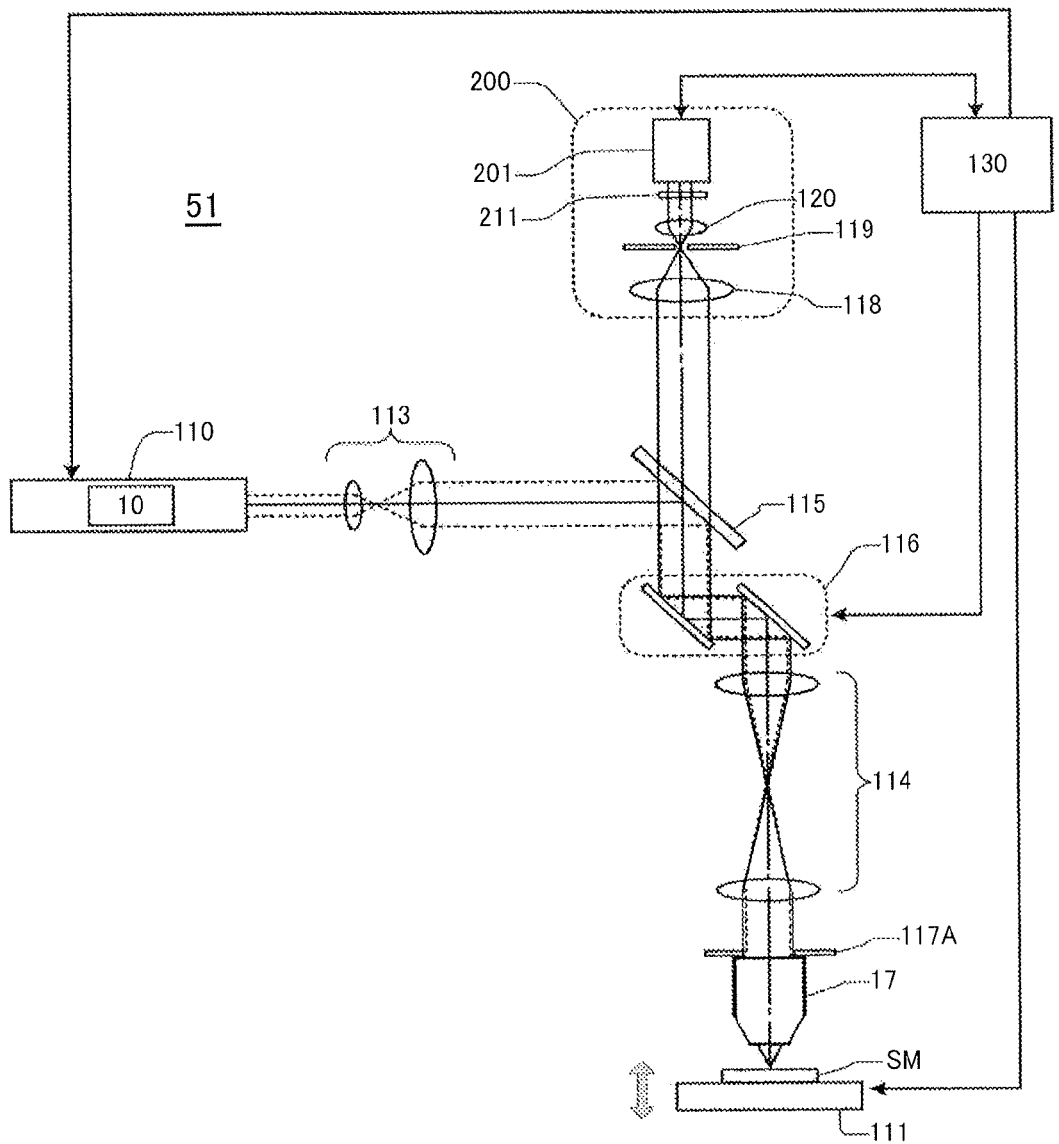
FIG. 7 schematically illustrates the configuration of a two-photon excitation fluorescence microscope apparatus 51 using, as a light source, a femtosecond pulse laser source utilizing the wide-band optical amplifiers relating to the first to fourth embodiments.

FIG. 7 schematically illustrates the configuration of a two-photon excitation fluorescence microscope apparatus 51 using the femtosecond pulse laser source 110, which is an optical pulse generator relating to the above-described embodiments. As shown in FIG. 7, the two-photon excitation fluorescence microscope apparatus 51 includes the femtosecond pulse laser source 110, a stage 111 on which a sample SM is placed, a beam expander 113, and a dichroic mirror 115. The femtosecond pulse laser source 110 includes the wide-band optical amplifier 10 relating to the first embodiment. Alternatively, the femtosecond pulse laser source 110 may include one of the wide-band optical amplifiers 20, 30 and 40 relating to the second to fourth embodiments.

The microscope apparatus 51 further includes a scanner 116, a relay optical system 114, a diaphragm 117A, an objective lens 117, a detector 200, a stage 111, and a controller 130. The scanner 116 is constituted by two galvanometer mirrors (an X scan mirror and a Y scan mirror) that are disposed in such a manner that their rotation axes are perpendicular to each other. The diaphragm 117A has an aperture whose size is similar to or slightly larger than the size of the pupil of the objective lens 117. The diaphragm 117A is thus configured so as not to block illumination light (or a pump beam) described later.

The detector 200 includes an imaging lens 118, a diaphragm 119, a lens 120, a bandpass filter 211, and a photomultiplier tube (PMT) 201. The bandpass filter 211 transmits a predetermined wavelength and blocks other wavelengths. The PMT 201 converts light into an electrical signal (a fluorescence signal representative of the amount of fluorescence). The PMT 201 produces a fluorescence signal for each location within the observed region of the sample SM.

The controller 130 generates a fluorescence image of the observed region of the sample SM based on the respective fluorescence signals produced by the PMT 201. The controller 130 also rotates the galvanometer mirrors of the scanner 116 to move the illuminated region (the laser spot) by the illumination light within the plane of the stage 111. The controller 130 can also move the stage 111 in the direction in which the optical axis of the illumination light extends (the direction shown by the arrows in FIG. 7).

The following describes how the two-photon excitation fluorescence microscope apparatus 51 operates.

The sample SM is placed on the stage 111. The sample SM is, for example, a cell sample labeled by a fluorescent dye. The fluorescent dye has an excitation wavelength (for one-photon excitation) of 395 nm and a fluorescence wavelength of 450 nm.

The femtosecond pulse laser source 110 emits, as the illumination light, a femtosecond pulse laser beam having a center wavelength of 790 nm at a frequency of 1 kHz, for example. Here, the illumination light is an ultrashort optical pulse whose duration is less than five femtoseconds. The illumination light (in the vicinity of 790 nm) emitted from the femtosecond pulse laser source 110 is converted by the beam expander 113 into a light beam with a large diameter and then enters the dichroic mirror 115. The dichroic mirror 115 is adapted so as to reflect wavelengths in the vicinity of 790 nm and transmit wavelengths in the vicinity of 450 nm. Thus, the illumination light emitted from the femtosecond pulse laser source 110 is reflected by the dichroic mirror 115, travels through the scanner 116, the relay optical system 114, the diaphragm 117A, and the objective lens 117 in the stated order, and is then collected onto the sample SM.

In the sample SM, the fluorescent molecules are two-photon excited at the center of the illuminated region (laser spot) of the illumination light, to generate fluorescence (two-photon excited fluorescence), which is a signal beam. Here, the size of the laser spot depends on the NA of the objective lens 117. Specifically speaking, as the NA increases, the size of the laser spot decreases and the spatial resolution of the present apparatus thus increases.

The two-photon excited fluorescence (in the vicinity of 450 nm) generated at the laser spot travels back the optical path of the illumination light that forms the laser spot, in other words, travels through the objective lens 117, the diaphragm 117A, the relay optical system 114, and the scanner 116 in this order, passes through the dichroic mirror 115, and then enters the detector 200.

After entering the detector 200, the two-photon excited fluorescence travels through the imaging lens 118, the diaphragm 119, the lens 120 and the bandpass filter 211 in the stated order, and then enters the PMT 201. Here, the bandpass filter 211 is adapted so as to transmit the wavelengths in the vicinity of 450 nm and remove the other wavelengths. Therefore, the two-photon excited fluorescence is allowed to transmit through the bandpass filter 211 and converted by the PMT 201 into an electrical signal (a fluorescence signal representative of the amount of the fluorescence).

Driving the scanner 116 through the controller 130 causes the laser spot to two-dimensionally scan the observed region on the sample SM (the field of view provided by the objective lens 117). While the laser spot is at each location within the observed region, the PMT 201 produces a fluorescence signal. The fluorescence signal produced for each location is sent to the controller 130. The controller 130 generates a fluorescence image of the observed region based on the respective fluorescence signals. The controller 130 can create a three-dimensional image of the sample SM by producing fluorescence signals while moving the stage 111 up and down in the optical axis direction and controlling the laser spot to two-dimensionally scan the sample SM.

The femtosecond pulse laser source 110 is an optical pulse generator having the wide-band optical amplifier relating to one of the first to fourth embodiments. Therefore, the femtosecondpulse laser source 110 can generate an ultrashort optical pulse whose duration is less than five femtoseconds. Consequently, the two-photon excitation fluorescence microscope apparatus 51 can achieve a higher temporal resolution, thereby being capable of observing a faster phenomenon in the sample SM.

<Sixth Embodiment>

The following describes a hybrid nonlinear optical microscope apparatus 53 relating to a sixth embodiment. The following only mentions the differences from the fifth embodiment.

Figure 8:
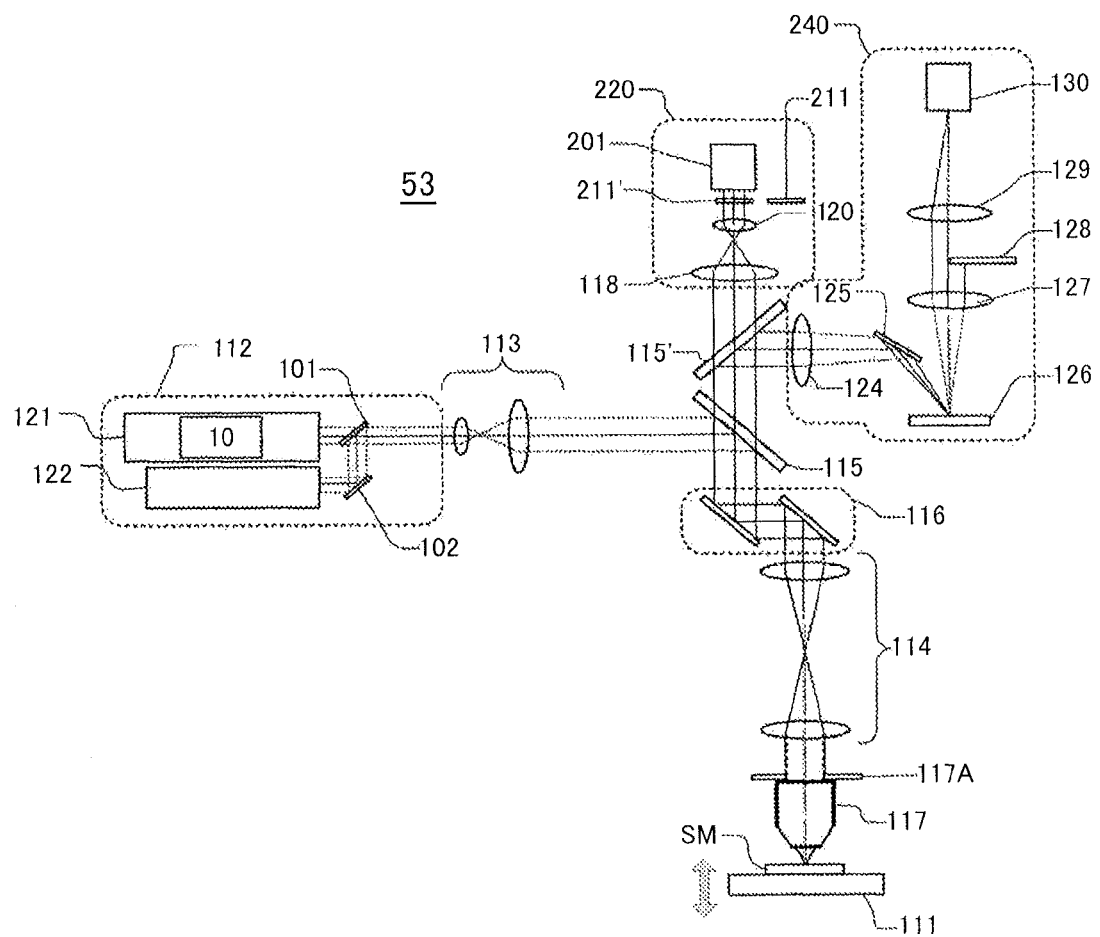
FIG. 8 illustrates the configuration of a microscope of a nonlinear optical microscope apparatus 53 using, as a light source, a femtosecond pulse laser source utilizing the wide-band optical amplifiers relating to the first to fourth embodiments.

FIG. 8 illustrates the configuration of a microscope of the nonlinear optical microscope apparatus 53.

As shown in FIG. 8, the nonlinear optical microscope apparatus 53 relating to the sixth embodiment utilizes various detection techniques such as second harmonic generation, coherent anti-Stokes Raman scattering, in addition to two-photon excitation.

The nonlinear optical microscope apparatus 53 relating to the sixth embodiment includes two laser sources 121 and 122. One of the laser sources is a femtosecond pulse laser source 121 that is used for the two-photon excitation, second harmonic generation, and coherent anti-Stokes Raman scattering techniques. The other laser source is a laser source 122 that is used for the coherent anti-Stokes Raman scattering technique. When observation is performed based on the coherent anti-Stokes Raman scattering technique, the femtosecond pulse laser source 121 is used to emit an anti-Stokes beam and the laser source 122 is used to emit a pump beam.

The nonlinear optical microscope apparatus 53 relating to the sixth embodiment further includes a first detector 220 and a second detector 240. Between the first detector 220 and the dichroic mirror 115, a dichroic mirror 115' is disposed. The dichroic mirror 115' reflects the coherent Stokes Raman scattered light generated by the sample SM and guides the coherent Stokes Raman scattered light to the second detector 240, and transmits the two-photon excited fluorescence and the second harmonic generated by the sample SM and guides the two-photon excited fluorescence and the second harmonic to the first detector 220.

The first detector 220 is used for observation based on both of the two-photon excitation and second harmonic generation techniques, and has the same configuration as the detector 200 relating to the fifth embodiment. However, the first detector 220 includes the bandpass filter 211 and a bandpass filter 211'. The bandpass filter 211 is for the observation based on the two-photon excitation technique, and the bandpass filter 211' transmits the second harmonic and cuts off other wavelengths.

The second detector 240 is used for observation based on the coherent anti-Stokes Raman scattering technique. The second detector 240 includes a lens 124, a mirror 125, a splitting element 126, a lens 127, a blocker 128, a lens 129, and a sensor 130. The blocker 128 functions to transmit coherent Stokes Raman scattered light and blocks other light.

When both the femtosecond pulse laser source 121 and the laser source 122 are driven in the nonlinear optical microscope apparatus 53, the sample SM is irradiated with the anti-Stokes beam and the pump beam. As a result, the sample SM generates a second harmonic and a two-photon excited fluorescence, which enters the first detector 220. The sample SM also generates coherent Stokes Raman scattered light, which is detected by the second detector 240.

Here, if the bandpass filter 211 designed for the two-photon excitation technique is inserted into the optical path for the first detector 220, the first detector 220 can detect the two-photon excited fluorescence. Alternatively, if the bandpass filter 211' designed to transmit the second harmonic is inserted into the optical path for the first detector 220, the first detector 220 can detect the second harmonic.

The sixth embodiment also uses the femtosecond pulse laser source 121 that can emit an ultrashort optical pulse whose duration is less than five femtoseconds, as in the fifth embodiment. Therefore, the nonlinear optical microscope apparatus 53 can achieve a higher temporal resolution, thereby being capable of observing a faster phenomenon in the sample SM.

The fifth and sixth embodiments provide microscope apparatuses using a femtosecond pulse laser source that emits an ultrashort optical pulse whose duration is less than five femtoseconds. The optical instrument using such a femtosecond pulse laser source that emits an ultrashort optical pulse whose duration is less than five femtoseconds is not limited to such microscope apparatuses. As an alternative example, the femtosecond pulse laser that emits an ultrashort optical pulse can be applied to a laser machine.

What is claimed is:

1. A wide-band optical amplifier comprising:
a first amplifier that emits, based on a to-be-amplified light beam having a predetermined range of wavelengths and a first pump beam having a first wavelength, the to-be-amplified light beam having a first range of amplified wavelengths, the first range being a part of the predetermined range;
and a second amplifier that emits, based on the to-be-amplified light beam having the first range of amplified wavelengths and a second pump beam having a second wavelength different from the first wavelength, the to-be-amplified light beam having a second range of amplified wavelengths, the second range being different from the first range;
wherein the first amplifier is a first nonlinear crystal, and an angle formed between an optical axis of the first nonlinear crystal and the first pump beam is adjusted and an angle formed in the first nonlinear crystal between the to-be-amplified light beam and the first pump beam is adjusted,
the second amplifier is a second nonlinear crystal, and an angle formed between an optical axis of the second nonlinear crystal and the second pump beam is adjusted and an angle formed in the second nonlinear crystal between the to-be-amplified light beam and the second pump beam is adjusted
the to-be-amplified light beam and the first pump beam enter the first nonlinear crystal non-coaxially at an angle relative to each other, and the to-be-amplified light beam and the second pump beam enter the second nonlinear crystal non-coaxially at an angle relative to each other.

2. The wide-band optical amplifier as set forth in claim 1, wherein the first range of wavelengths is a range of long wavelengths in the predetermined range of wavelengths, and the second range of wavelengths is a range of short wavelengths in the predetermined range of wavelengths.

3. The wide-band optical amplifier as set forth in claim 1, wherein the to-be-amplified light beam having the predetermined range of wavelengths is a white light beam.

4. The wide-band optical amplifier as set forth in claim 3, comprising a nonlinear converter that converts a laser beam having a predetermined wavelength into the white light beam.

5. The wide-band optical amplifier as set forth in claim 1, wherein the predetermined range of wavelengths includes wavelengths of 350 nm to 790 nm.

6. The wide-band optical amplifier as set forth in claim 1, comprising:
a first converter that converts a laser beam having a predetermined wavelength into an N-th harmonic and supplies the N-th harmonic as the first pump beam;
and a second converter that converts the laser beam having the predetermined wavelength into an (N+1)-th harmonic and supplies the (N+1)-th harmonic as the second pump beam.

7. The wide-band optical amplifier as set forth in claim 6, comprising a beam splitter that splits the laser beam.

8. The wide-band optical amplifier as set forth in claim 1, comprising a refractive element that receives the first pump beam and the second pump beam in a same direction and emits the first pump beam and the second pump beam in different directions.

9. An optical pulse generator comprising:
a fundamental laser source that outputs a laser beam having a predetermined wavelength;
a first converter that converts the laser beam into an N-th harmonic and emits the N-th harmonic as a first pump beam;
a second converter that converts the laser beam into an (N+1)-th harmonic and emits the (N+1)-th harmonic as a second pump beam;
a first amplifier that emits, based on a to-be-amplified light beam having a predetermined range of wavelengths and the first pump beam, the to-be-amplified light beam having a first range of amplified wavelengths, the first range being a part of the predetermined range;
and a second amplifier that emits, based on the to-be-amplified light beam having the first range of amplified wavelengths and the second pump beam, the to-be-amplified light beam having a second range of amplified wavelengths, the second range being different from the first range;
wherein the first amplifier is a first nonlinear crystal, and an angle formed between an optical axis of the first nonlinear crystal and the first pump beam is adjusted and an angle formed in the first nonlinear crystal between the to-be-amplified light beam and the first pump beam is adjusted,
the second amplifier is a second nonlinear crystal, and an angle formed between an optical axis of the second nonlinear crystal and the second pump beam is adjusted and an angle formed in the second nonlinear crystal between the to-be-amplified light beam and the second pump beam is adjusted
the to-be-amplified light beam and the first pump beam enter the first nonlinear crystal non-coaxially at an angle relative to each other, and
the to-be-amplified light beam and the second pump beam enter the second nonlinear crystal non-coaxially at an angle relative to each other.

10. An optical instrument using the optical pulse generator as set forth in claim 9 as a light source.

* * * * *